United States Patent

Bodere et al.

[11] Patent Number: 5,817,537
[45] Date of Patent: Oct. 6, 1998

[54] METHOD FOR INTEGRATING A LOCALIZED BRAGG GRATING INTO A SEMICONDUCTOR

[75] Inventors: Alain Bodere, Bruyeres le Chatel; Danièle Carpentier, Evry, both of France

[73] Assignee: Alcatel Optronics, Paris, France

[21] Appl. No.: 772,528

[22] Filed: Dec. 24, 1996

[30] Foreign Application Priority Data

Dec. 28, 1995 [FR] France .................................... 95 15659

[51] Int. Cl.$^6$ ........................................ H04S 3/18
[52] U.S. Cl. ...................... 438/32; 438/31; 438/29; 430/321; 385/10; 372/96
[58] Field of Search ................... 438/32, 23, 31, 438/29; 430/325, 321; 372/96; 385/10

[56] References Cited

U.S. PATENT DOCUMENTS

| 5,004,673 | 4/1991 | Vlannes | 430/325 |
|---|---|---|---|
| 5,274,660 | 12/1993 | Abe | 372/96 |
| 5,288,659 | 2/1994 | Koch et al. | 438/31 |

FOREIGN PATENT DOCUMENTS

| 0110184A1 | 6/1984 | European Pat. Off. |
| 0604407A2 | 6/1994 | European Pat. Off. |
| 0606092A1 | 7/1994 | European Pat. Off. |

OTHER PUBLICATIONS

Webster's II New College Dictionary, Houghton Mifflin, p. 672 (no month given), 1995.

Primary Examiner—Charles L. Bowers, Jr.
Assistant Examiner—Keith Christianson
Attorney, Agent, or Firm—Sughrue, Mion, Zinn, Macpeak & Seas, PLLC

[57] ABSTRACT

A Bragg grating is produced in a semiconductor component by wet etching through a resin mask developed after holographic exposure. This causes the regions of the grating at the boundary of other parts of the component to be etched more deeply. To compensate this, the method includes further irradiation through a second mask disposed at a distance from the part of the resin mask that defines the location of the grating. Applications include opto-electronic components.

4 Claims, 3 Drawing Sheets

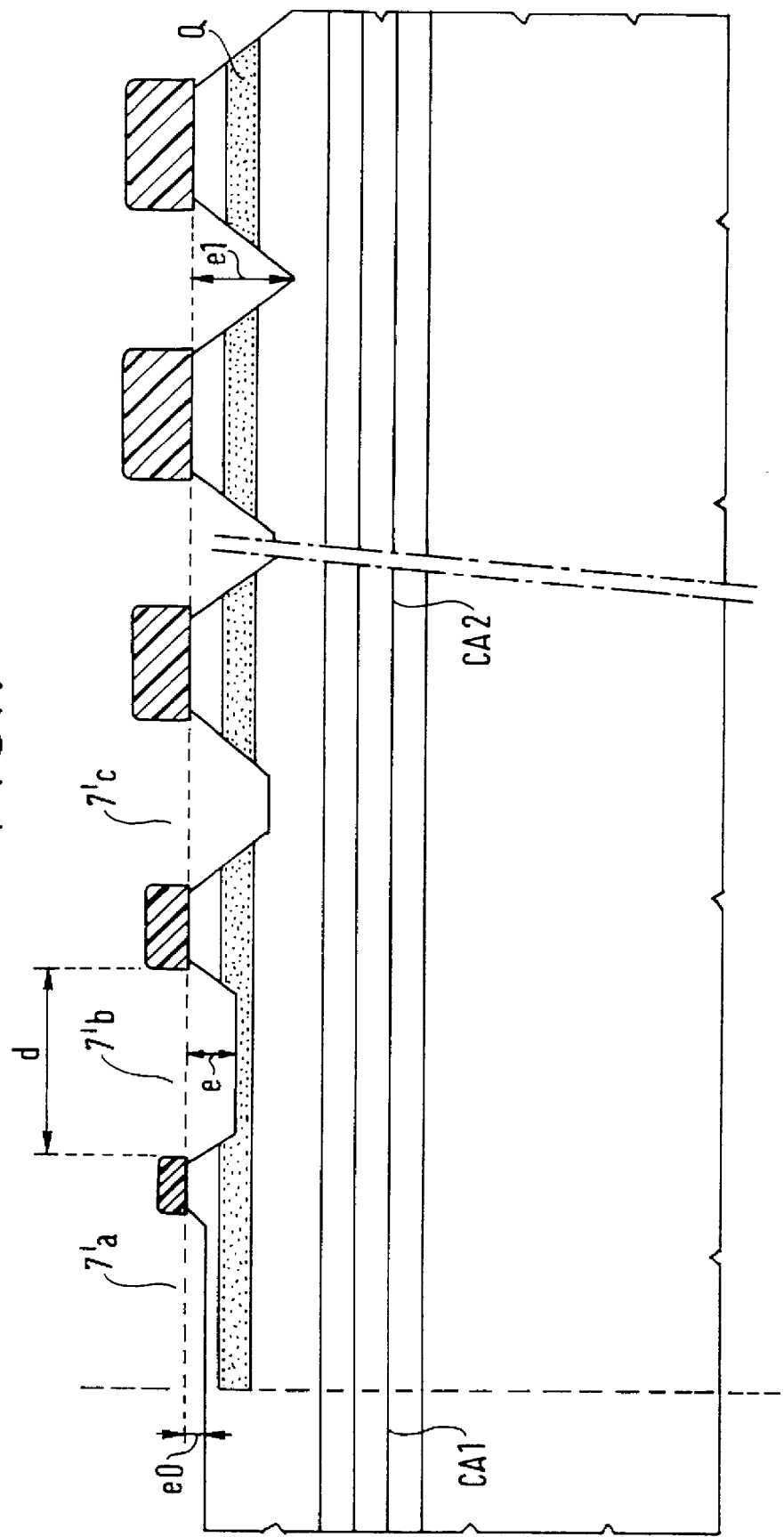

METHOD FOR INTEGRATING A LOCALIZED BRAGG GRATING INTO A SEMICONDUCTOR

BACKGROUND OF THE INVENTION

1. Field of the Invention

The invention is in the field of opto-electronic components and more particularly concerns devices including at least one localized Bragg grating, i.e. in which there is at least one transition between a region containing a grating and at least one adjoining part with no grating.

2. Description of the Prior Art

Examples of components of this type include distributed Bragg reflector (DBR) lasers and integrated modulator (ILM) lasers in which the laser part includes a DBR Bragg reflector or employs distributed feedback (DFB).

FIGS. 1 through 4 show a conventional method of fabricating a localized Bragg grating. They concern the special case of a laser L with integrated modulator M fabricated on an indium phosphide InP substrate. As shown in FIG. 2, the grating is made by depositing a quaternary layer Q on top of a guide or active layer CA2, the quaternary layer having a different index than the surrounding substrate. One step in the fabrication of the grating is wet etching of this layer through a resin mask 6 reproducing the design of the grating to be obtained. After dissolving the resin, the substrate is grown epitaxially.

As the grating is a localized grating, the regions of the component that are not to include any grating are protected from the etching. A layer 5 of silica deposited on the surface of the region M to be protected is used for this, for example, as shown in FIG. 3.

The etch is a wet etch, i.e. it employs an etching solution based on bromium, for example. It is then found that the depth of etching through the resin mask is usually not uniform. To be more precise, the depth is greater in the areas of the grating that are at the boundary of neighboring regions. This phenomenon is shown diagrammatically in FIG. 4.

As the etching rate is greater in the transition area than in the other parts of the grating, there is the risk of the guide layer being etched in this boundary area.

An aim of the invention is to remedy this drawback.

SUMMARY OF THE INVENTION

To this end, the invention consists in a method of fabricating at least one localized Bragg grating in a semiconductor component, comprising a step of wet etching one face of said component through an etching mask placed on said face and formed of a photo sensitive resin layer developed after a holographic irradiation step defining the pattern of said grating, wherein said holographic irradiation step is preceded and/or followed by a step of further irradiation of said face after disposing a second mask at a distance from said resin layer, said mask having a part defining the location of said grating, and at least the side of said part facing towards said resin layer is reflective.

Advantageously, the holographic irradiation step is followed by a development step that precedes the further irradiation step. This has the advantage of enabling the quality of the resin mask to be monitored as it is applied.

Other features and advantages of the invention will emerge from the remainder of the description, which is given with reference to the figures.

BRIEF DESCRIPTION OF THE DRAWINGS

FIGS. 5 through 9 show the method of the invention.

DETAILED DESCRIPTION OF THE PREFERRED EMBODIMENT

Figure 1:
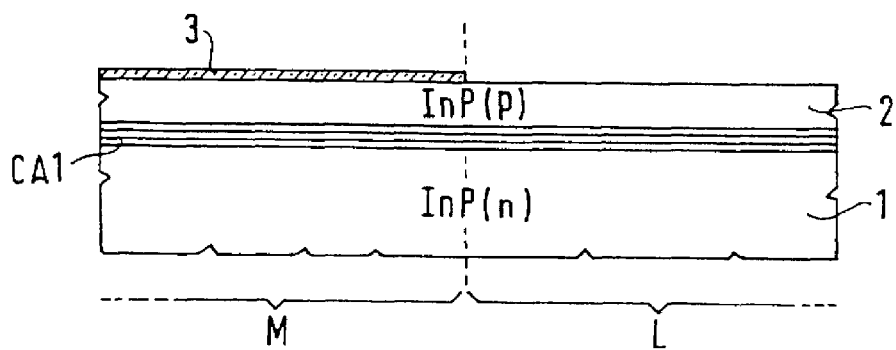
FIGS. 1 through 4 show the main steps in the fabrication of a localized Bragg grating by a prior art method.
Figure 2:
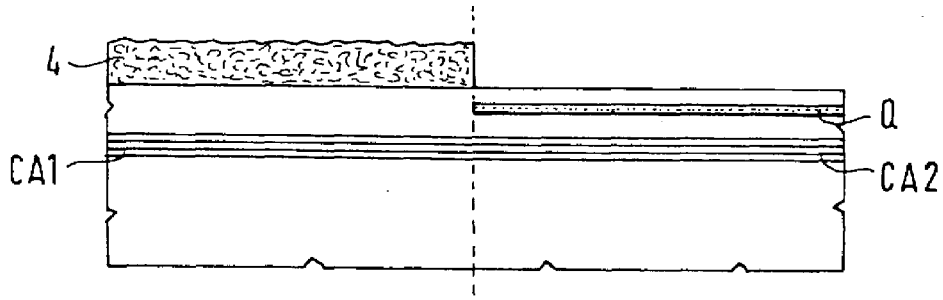

The invention will be described by way of non-limiting example in the specific case of fabricating an integrated modulator laser on an indium phosphide substrate. As shown in FIG. 1, the component is in two parts: a modulator part M and an adjacent laser part L. The first fabrication step forms the guide layer CA1 of the modulator M by epitaxial growth on the n-doped indium phosphate substrate 1. A p-doped indium phosphate top confinement layer 2 is then grown. The modulator part M is then protected by a silica mask 3. The laser part is then etched to eliminate the guide layer CA1 in this part. The active layer CA2 of the laser, a p-doped indium phosphate top confinement layer, a quaternary layer Q having an index different than the top confinement layer and a further p-doped indium phosphate layer are then grown in succession. FIG. 2 shows the result. It also shows a silica and polycrystalline layer 4 resulting from the preceding operations. This layer 4 must be removed and replaced with a new silica mask 5 for correct sequencing of the operations.

Figure 3:
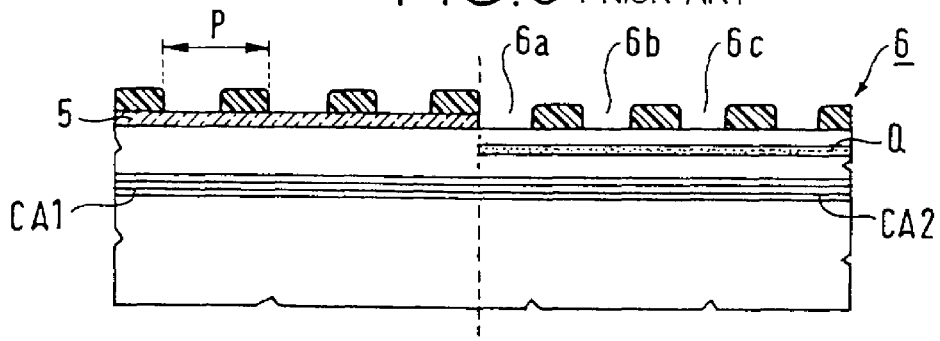

To produce the resin mask defining the pattern of the grating, a layer of photosensitive resin is deposited on the surface of the component and exposed holographically. Development produces the mask 6 shown in FIG. 3. The mask is in the form of a succession of regularly spaced openings 6a, 6b, 6c the pitch p of which defines the wavelength of the laser.

A bromium-based wet etch is then carried out to etch the quaternary layer Q at the pitch P of the grating. Further growth of p-doped InP produces the alternation of index at the level of the quaternary layer Q.

Figure 4:
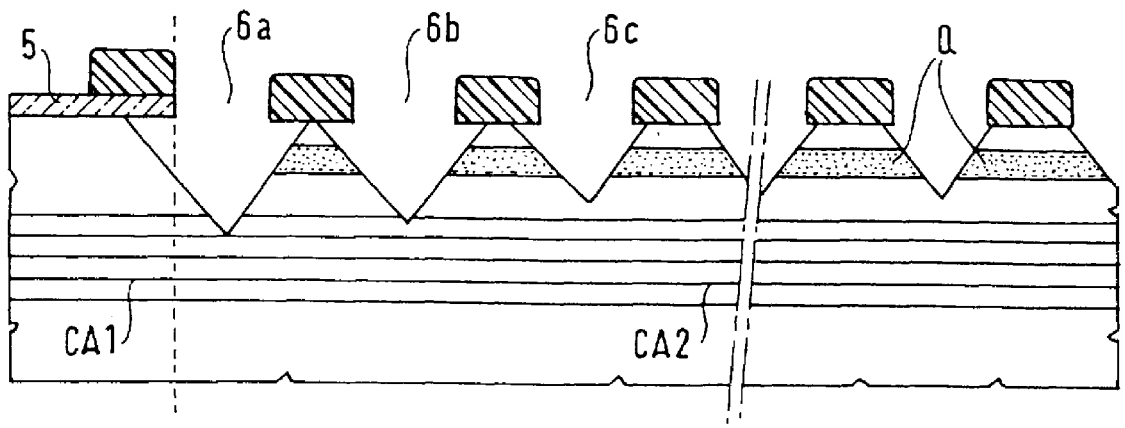

As shown in FIG. 4, the area of the laser part near the modulator part is etched much more deeply than remote areas. This introduces a significant risk of damage to the active layer CA2.

Figure 5:
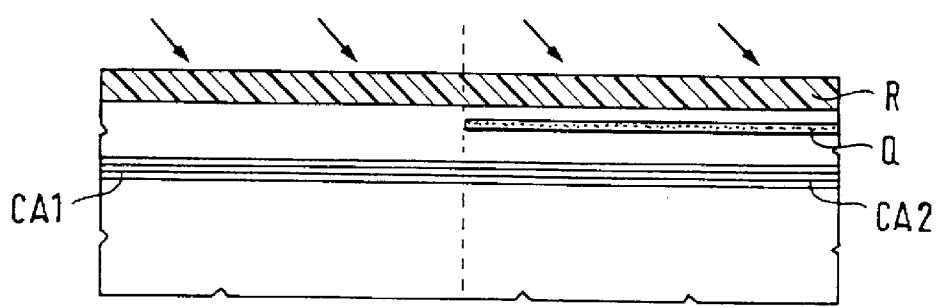
Figure 6:
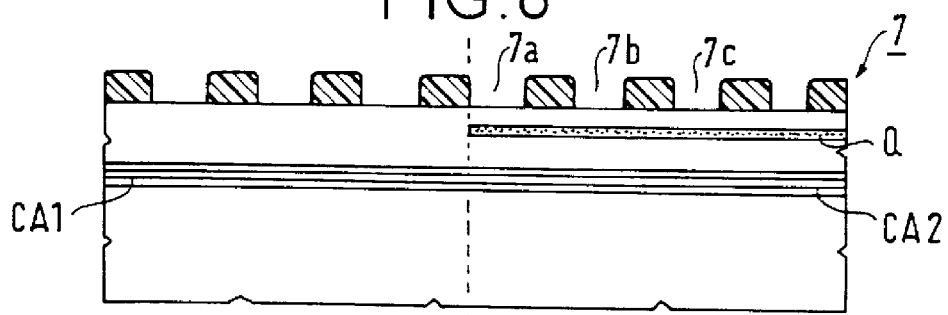
Figure 7:
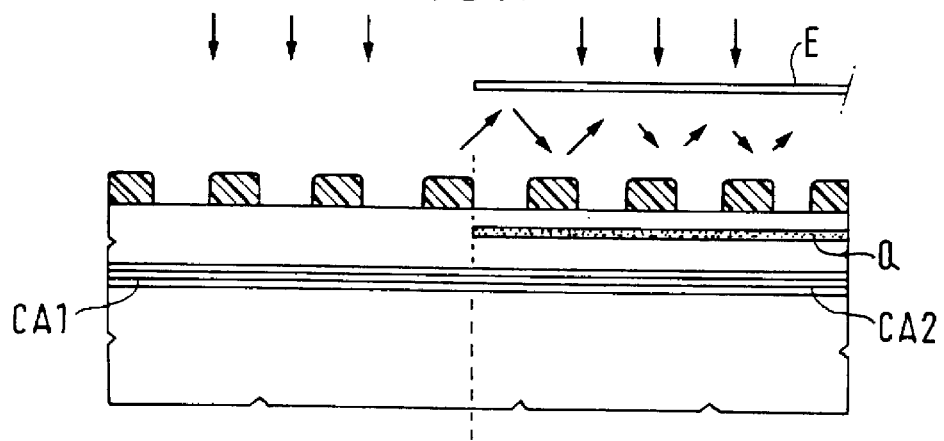

To solve this problem, the invention proposes to modify the method from the step shown in FIG. 2. As discussed previously, the silica and polycrystalline layer 4 is removed but then the resin layer R is deposited directly, as shown in FIG. 5. Holographic exposure and development produce the resin mask 7 shown in FIG. 6. As before, the openings in the mask are regularly spaced and of constant width. Then a second mask is placed at a distance from the resin layer, as shown in FIG. 7. This mask has a part E of which at least the side facing towards the resin is reflective. The surface of the component is then exposed through this mask. As the bottom face of the part E is reflective, the resin underneath is partly irradiated with an energy that decreases in the direction away from the edge of the part E.

Figure 8:
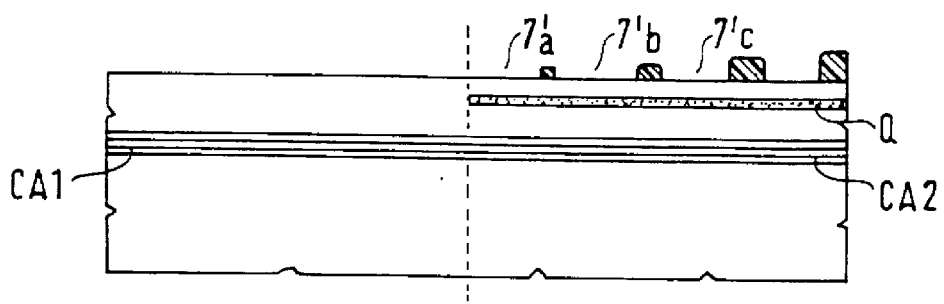

After further development, the mask is as shown in FIG. 8. The resin is entirely removed from the modulator part, while the laser part has a mask with the widths of the openings 7'a, 7'b', 7'c increased in the boundary area, the width of the openings reducing in the distance away from the modulator part.

The result of the wet etch is shown diagrammatically in FIG. 9. Note that the increase in the opening width d has reduced the etched depth e, so compensating the transition effect. On the other hand, in the regions remote from the boundary area the depth $e_1$ is virtually constant. It is noteworthy that another effect of this method is to etch the modulator part to a shallow depth $e_0$. This has the beneficial consequence of improving the surface state in this part and therefore of favoring subsequent further epitaxial growth.

A similar result would be obtained if the order of the two types of exposure were reversed with a single final development. Likewise, the further irradiation could be carried out partly before and partly after the holographic exposure. It is nevertheless preferable to carry out the holographic exposure first and to develop the mask immediately in order to be able to monitor correct execution of these operations.

The implementation details must naturally be adapted to each individual application.

Thus the further irradiation step power and exposure time must be defined to suit the reflection coefficient of the part E and its distance from the resin layer. These parameters are not always critical as variations in the extent of the boundary area have little influence on the functioning of the grating.

For example, to obtain a 5 µm boundary area with a chromium reflective mask 10 µm from the surface, an exposure energy of 100 mJ/cm² would be suitable for a resin thickness between 50 nm and 100 nm.

There is claimed:

1. A method of fabricating at least one localized Bragg grating in a semiconductor component comprising a step of wet etching one face of said component through an etching mask placed on said face and formed of a photo sensitive resin layer developed after a holographic irradiation step defining the pattern of said grating, wherein said holographic irradiation step is preceded and/or followed by a step of further irradiation of said face after disposing a second mask at a distance from said resin layer, said mask having a part with a side facing towards said resin layer in the location of said grating, said side being reflective.

2. The method claimed in claim 1 wherein said holographic irradiation step is followed by a development step that precedes said further irradiation step.

3. The method claimed in claim 1 wherein said reflective face of said part of said second mask is composed of chromium.

4. The method claimed in claim 1 wherein said further irradiation step is defined by an irradiation power and an exposure time that are conditioned by the reflection coefficient of said reflective face and the distance between said second mask and said resin layer.

* * * * *